US011515261B2

(12) United States Patent
Shanmugam et al.

(10) Patent No.: US 11,515,261 B2
(45) Date of Patent: Nov. 29, 2022

(54) MULTIPLE COMPONENT INTEGRATION IN FANOUT PACKAGE WITH DIFFERENT BACK SIDE METALLIZATION AND THICKNESSES

(71) Applicant: Apple Inc., Cupertino, CA (US)

(72) Inventors: Karthik Shanmugam, Singapore (SG); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/027,097

(22) Filed: Sep. 21, 2020

(65) Prior Publication Data

US 2022/0093523 A1 Mar. 24, 2022

(51) Int. Cl.

| | |
|---|---|
| ***H01L 23/538*** | (2006.01) |
| ***H01L 25/16*** | (2006.01) |
| ***H05K 1/18*** | (2006.01) |
| ***H01L 21/56*** | (2006.01) |
| ***H01L 23/485*** | (2006.01) |

(52) U.S. Cl.

CPC ........ *H01L 23/5389* (2013.01); *H01L 21/568* (2013.01); *H01L 23/485* (2013.01); *H01L 23/5383* (2013.01); *H01L 25/165* (2013.01); *H01L 25/167* (2013.01); *H05K 1/185* (2013.01)

(58) Field of Classification Search

CPC . H01L 23/5389; H01L 21/568; H01L 23/485; H01L 23/5383; H01L 25/165; H01L 25/167; H05K 1/185

See application file for complete search history.

(56) References Cited

U.S. PATENT DOCUMENTS

| | | | |
|---|---|---|---|
| 10,177,119 B2 | 1/2019 | Zhang et al. | |
| 10,203,398 B2 | 2/2019 | Chen | |
| 2013/0270682 A1* | 10/2013 | Hu | H01L 24/81 257/E21.705 |
| 2016/0148987 A1* | 5/2016 | Popp | H01L 27/3269 257/40 |
| 2016/0315071 A1* | 10/2016 | Zhai | H01L 24/24 |
| 2017/0229426 A1 | 8/2017 | Hung et al. | |
| 2019/0148342 A1* | 5/2019 | Hu | H01L 23/5385 257/659 |
| 2020/0273840 A1* | 8/2020 | Elsherbini | H01L 24/17 |
| 2020/0344869 A1* | 10/2020 | So | H01Q 1/38 |
| 2021/0098380 A1* | 4/2021 | Chen | H01L 21/78 |

FOREIGN PATENT DOCUMENTS

| | | |
|---|---|---|
| JP | 2009260165 A | 11/2009 |

* cited by examiner

*Primary Examiner* — Fernando L Toledo
*Assistant Examiner* — Neil R Prasad
(74) *Attorney, Agent, or Firm* — Aikin & Gallant, LLP

(57) ABSTRACT

One or more stud bumps may form a conductive column to a component having back side metallization. In an embodiment, the column of stud bumps may be about 130 um vertically (Z-direction). Providing a microelectronics package with a column of stud bumps electrically connected to a component having back side metallization may provide a cost effective electrical interconnect and may enable the incorporation of components of different thicknesses, including that the component thicknesses are independent of each other, in a single fanout package, while providing a thin package profile and back side surface finish integration.

16 Claims, 6 Drawing Sheets

MULTIPLE COMPONENT INTEGRATION IN FANOUT PACKAGE WITH DIFFERENT BACK SIDE METALLIZATION AND THICKNESSES

BACKGROUND

Field

Embodiments described herein relate to microelectronic packaging, and more specifically to packages including multiple diverse components.

Background Information

Microelectronics packages have been manufactured in decreasing sizes, but manufacturing tolerances at times can increase rejection rates and limit production rates, while the use of different sized components within a single package may interfere with further package size reduction. Additionally, when attempting to integrate multiple components into a single package, the thicknesses of the components may need to be dependent on each other in order to fit within a single package.

SUMMARY

Packages are described in which a package may include a first component, a second component, and a molding compound layer, the first component and the second component stacked back-to-back and encapsulated in the molding compound layer, and a third component encapsulated in the molding compound layer. A front side wiring layer may be on and in electrical connection with the first component and the third component, and an electrically conductive column may extend from a back side of the third component and be encapsulated in the molding compound. A back side wiring layer may be on and in electrical connection with the second component and the electrically conductive column of stacked stud bumps.

In an embodiment, the electrically conductive column may comprise a plurality of stacked stud bumps.

In embodiments, the third component may include a backside metallization layer, and the electrically conductive column of stacked stud bumps may electrically connect the metallization layer to the back side wiring layer.

In embodiments, the second component may include at least one electrically conductive pad on a side opposite the first component, the back side wiring layer may include at least one conductive trace, and there may be at least one via extending between and electrically connecting the at least one electrically conductive pad of the second component and the at least one conductive trace of the back side wiring layer.

In embodiments, at least one electrically conductive bump may be in electrical communication with and on the back side wiring layer, and the at least one bump may be positioned on a side of the back side wiring layer opposite the front side wiring layer.

In embodiments, the first component may include a top side and a back side, the second component may comprise a top side and a back side, with the first component back side and the second component back side mounted together to form a back-to-back stack, and the first component back side and the second component back side are not in electrical communication.

In embodiments, the second component includes at least one electrically conductive pad on a side opposite the first component, the back side wiring layer comprises at least one conductive trace, and the second component is in electrical communication with the third component through the electrically conductive column and the back side wiring layer.

In embodiments, the third component may include at least one electrically conductive pad in electrical communication with the front side wiring layer. The third component may include a back side opposite the top side, with the back side including a metallization layer. The first component may include at least one electrically conductive pad in electrical communication with the front side wiring layer.

In embodiments, at least one vertical interconnect may extend completely between the front side wiring layer and the back side wiring layer. For example, exemplary vertical interconnects may be printed circuit board (PCB) bars, copper plated pillars, or other suitable electrical connectors. At least one electrically conductive bump may be in electrical communication with and on the back side wiring layer, the at least one bump may be positioned on a side of the back side wiring layer opposite the front side wiring layer, and the at least one electrically conductive bump may be in electrical communication with the front side wiring layer through the at least one electrically conductive vertical interconnect. In embodiments, the at least one vertical interconnect may include a plurality of vertical interconnects.

In embodiments, a first optical window may be provided in the front side wiring layer over the first component, and a second optical window in the front side wiring layer over the third component. The first component may be a light emitter, and the third component may be a photodetector (PD). The PD may include a back side metallization layer, and the electrically conductive column may include a plurality of stacked stud bumps on the back side metallization layer, electrically connecting the back side metallization layer to the back side wiring layer.

In embodiments, a portable electronic device may include a housing having an opening and a package as described above, wherein the at least one of the first and third components is mounted adjacent to the opening.

Processes of fabrication of a package are described. A process may include placing first, second, third components and PCB bars (or) pre-formed copper pillars on a carrier, with the first and second components arranged back-to-back, and the third component including a back side metallization layer. A column may be formed of electrically conducting stud bumps on the third component metallization layer. The first, second, third components, copper pillars and the column of electrically conducting stud bumps, may be encapsulated in a molding compound to form a molding compound layer. The mold layer may be back ground to expose a portion of the column of electrically conducting stud bumps, and a wiring layer by be formed in direct electrical contact with the column of electrically conducting stud bumps and copper pillars.

BRIEF DESCRIPTION OF THE DRAWINGS

Inventions of the present application will now be described in more detail with reference to exemplary embodiments of the apparatus and methods, given only by way of example, and with reference to the accompanying drawings, in which.

DETAILED DESCRIPTION

Figure 1:
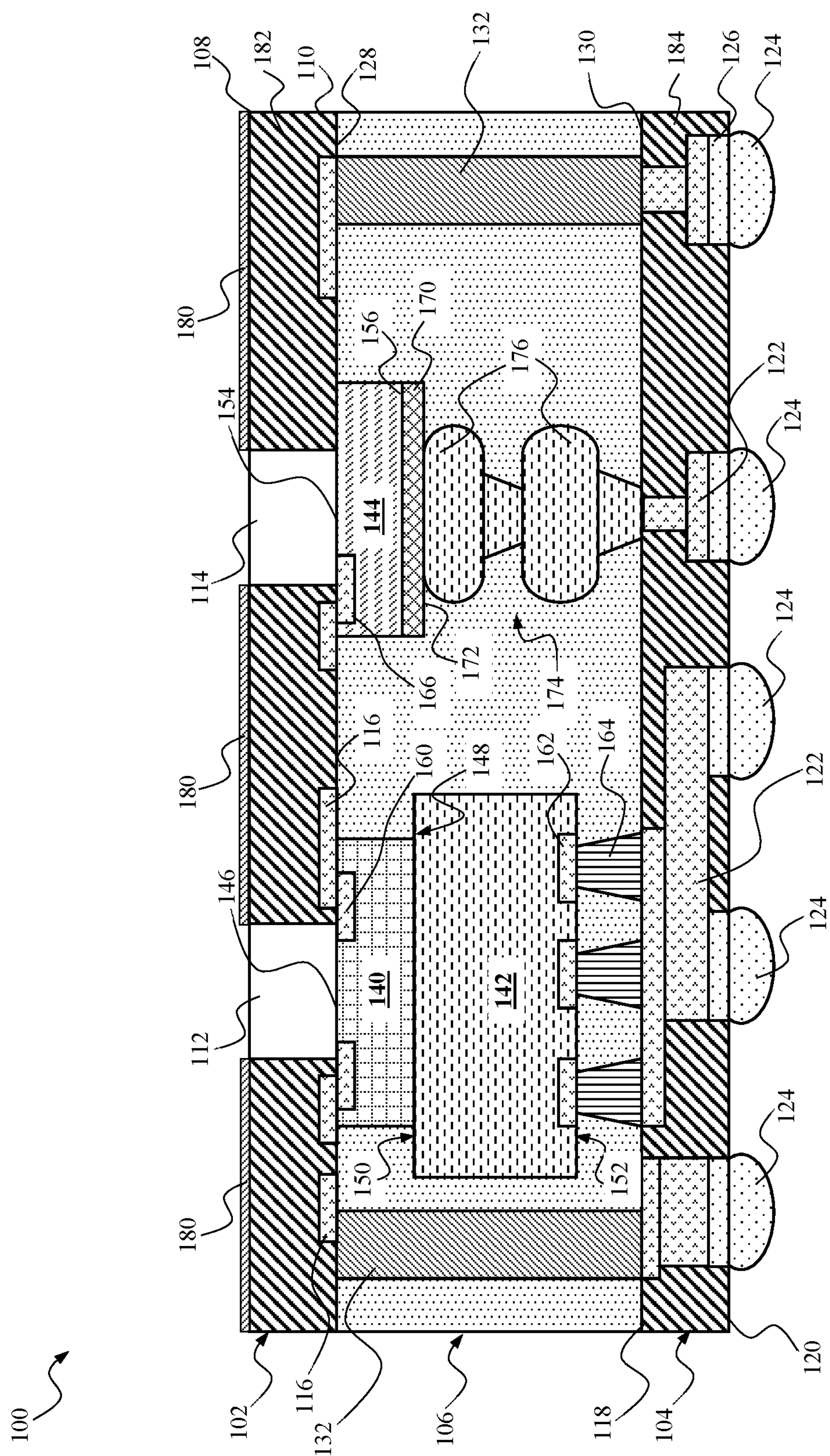
FIG. 1 illustrates a schematic cross-sectional side view illustration of an optical package including microelectronic components in accordance with an embodiment.

Referring to the drawing figures, like reference numerals designate identical or corresponding elements throughout the several figures.

The singular forms "a," "an," and "the" include plural referents unless the context clearly dictates otherwise.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known packaging techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over", or "on" another layer in "contact" with another layer may be directly in contact with the other layer or may have one or more intervening layers. One layer "between" layers may be directly in contact with the layers or may have one or more intervening layers.

In one aspect, embodiments described herein may include one or more stud bump(s) which form a conductive column to a component having back side metallization. In particular, use of stud bumps to form a back side electrical connection to a component provides a cost-effective electrical interconnect in which process parameters of forming the stacked stud bumps can be adjusted to control height of the resulting conductive column. Furthermore, this allows integration of the component and back side conductive column adjacent to a variety of components or stacked components within the same package. Formation of a conductive column with stacked stud bumps can also accommodate thickness variations for the component with back side metallization to which it is connected to, as well as for the adjacent components. Thus, the conductive column can be formed to compensate for thickness tolerances of various components, and from variations among vendors. Furthermore, such a stud bumping process is a non-destructive fabrication technique that avoids exposure to harmful conditions or chemicals, such as with etching or plating processes.

With reference to the drawing figures, an example embodiment of a package 100 is illustrated in FIG. 1. Package 100 may include a set of back-to-back stacked components 140, 142 laterally adjacent to a component 144 including a pad 166 on the its front side and back side metallization layer 170 on its back side, and a conductive column 174 of stacked stud bumps 176 formed on the back side metallization layer 170. Each of the components 140, 142, 144 and conductive column 174 of stacked stud bumps 176 may be encapsulated in a molding compound layer 106 along with one or more vertical interconnects 132, such as PCB bars, copper pillars, etc. A front side wiring layer, such as RDL 102 spans a top surface 128 the molding compound layer and in electrical contact with the one or more vertical interconnects 132, component 140 and component 144. A back side wiring layer such as RDL 104 spans a bottom surface 130 of the molding compound layer and on and in electrical contact with the one or more vertical interconnects 132, component 142 and conductive column 174 of stacked stud bumps 176.

In an embodiment, the package 100 is an optical package including one or more optical components. For example, component 140 may be a light emitter, and component 144 may be a photodetector. Component 142 may be a controller chip such as an application-specific integrated circuit (ASIC) or a field-programmable gate array (FPGA) which is in electrical communication with one or both of components 140, 144 though the RDLs 102, 104, vertical interconnects 132 and/or conductive column 174 of stacked stud bumps 176. While the following description may be made with specific reference to components of an optical package, it is to be appreciated that embodiments are not limited this implementation and may be applicable to other component arrangements including passive components like resistor, capacitors, inductors to integrate a component with both front and back side electrical connections.

As shown in FIG. 1, package 100 may include a front side wiring layer, which may be a redistribution layer (RDL), 102. Package 100 may include a back side wiring layer, which may be an RDL, 104, and a molding compound layer 106 between the top side RDL 102 and the back side RDL 104. Molding compound layer 106 may be formed of an electrically non-conductive (e.g., insulator, dielectric) material, as is well-understood in the art. The package may further include one or more microelectronic and/or electrically conductive subcomponents, described in greater detail elsewhere herein.

RDL 102 includes a top surface 108 and a bottom surface 110, and may include one or more optical windows 112, 114 which may extend entirely through a portion of the RDL in the Z-direction between the top and bottom surfaces and allow light transmission and detection, for reasons explained in greater detail elsewhere herein. RDL 102 may also include one or more dielectric layers 182 and one or more conductive redistribution lines or trace layers 116 (referred to as traces, only two are identified in FIG. 1, so as to not obscure other features of the structures illustrated in FIG. 1). It is to be appreciated that optical windows 112, 114 are optional, and may be included for optical package applications to allow light transmission and detection by the optical component(s). In other packaging solutions the components may not be optical components, and optical windows 112, 114 may not be formed.

RDL 104 includes a top surface 118 and a bottom surface 120. RDL 104 may include one or more dielectric layers 184 and one or more conductive redistribution lines or trace layers 122 (referred to as traces, only two are identified in FIG. 1, so as to not obscure other features of the structures illustrated in FIG. 1). Traces 122 may also provide electrical communication between other portions of RDL 104. In embodiments, one or a plurality of electrically conductive solder balls, solder bumps, or conductive bumps, herein referred to as bumps 124, may be attached to and extend downwardly from the bottom surface 120. Upper portions 126 of each bump 124 may extend into RDL 104 and be in electrical contact with one or more of the electrical traces 122. In this manner, electrical communication may be had between one or more of the bumps 124 and other component(s) of the package 100, as described elsewhere herein.

One or both of the dielectric layers 182, 184, may be formed in whole or in part of transparent oxides, polymers, and the like. Conductive traces 116, 122 may also be formed of transparent conductive oxides (TCOs), including but not limited to indium tin oxide (ITO), and/or transparent conductive polymers. The use of optically transparent materials in whole or in part for dielectric layers 182, 184 and/or traces 116, 122 assist light passing between a light emitter and a light detector, as described elsewhere herein. Conductive metals, e.g., copper, may still be used to form the conductive traces 116, 122, when contact pads on the components 140, 144 are outside the optical aperture of the component. Dielectric layers may also be formed in whole or in part of standard oxide, nitride, and polymer materials.

Molding compound layer 106 (which may be referred to herein as a mold layer, or simply a layer) may extend between RDL 102 and RDL 104. Molding compound layer 106 has a top surface 128 which may abut bottom surface 110 of RDL 102, and a bottom surface 130 which may abut top surface 118 of RDL 104. Molding compound layer 106 may include one or a plurality of conductive vertical interconnects 132 extending through the molding compound layer 106 between the bottom surface 110 of RDL 102, at which the vertical interconnect 132 may form portion of top surface 128 of layer 106, and the top surface 118 of RDL 104, at which the vertical interconnect 132 may form a portion of bottom surface 130 of molding compound layer 106. One or more of the conductive vertical interconnects 132 may extend, and provide an electrical communication pathway, between one or more trace(s) 116 in RDL 102 and trace(s) 122 in RDL 104, which thus may provide one or more electrical communication paths between RDL 102, RDL 104, and one or more electrically conductive and/or microelectronic subcomponents in electrical communication with each RDL. Conductive vertical interconnects 132 may be formed as plated copper pillars, conductive PCB bars, and the like.

Molding compound layer 106 may include one or more components. The components may include active components (e.g., dies, integrated circuits, etc.), passive components (emitters, photodetectors, resistor, inductor, capacitor, etc.), electromechanical components, etc., any of which may be discrete components. In embodiments, molding compound layer 106 includes, but is not limited to, a first component 140, a second component 142, and a third component 144. Component 140 includes a top surface 146 and a bottom surface 148; component 142 includes a tap bottom surface 150 and a top surface 152; and component 144 includes a top surface 154 and a bottom surface 156. In embodiments, component 140 and component 142 may be oriented back-to-back, with surfaces 148 and 150 in physical contact, but which may not form any electrical communication between the two components. Orienting components back-to-back may permit the package to have a smaller form factor and more structurally robust structure, while using simple processing techniques.

In embodiments, components 140 and 144 may be or include emitters, such as a light-emitting diode (LED), and photodetectors, e.g., photodiodes, respectively, and component 142 may be a controller chip such as an application-specific integrated circuit (ASIC) or a field-programmable gate array (FPGA) which is in electrical communication with one or both of components 140, 144. Such components are merely examples of packaging components with single side pads, and front side and back side pads, while still permitting one or more conductive columns as described elsewhere herein to compensate for thickness variations of the components. As described in greater detail elsewhere herein, when one or more of components 140, 144 emits and/or detects light, optical windows 112, 114 may be provided in RDL 102 so that light can pass through the RDL 102 from a light emitter and be detected by an optical detector. Optionally, one or more of optical windows 112, 114 may be partially or completely filled with one or more optically transparent materials.

Component 140 may include one or more electrical pads 160 or the like which may form portions of the top surface 146. Pads 160 are in electrical communication with the component 140 itself, for transmitting electrical signals to and from the component in a known manner. In embodiments, one or more of the pads 160 are in electrical contact with one or more of the traces 116 of RDL 102; in the example of FIG. 1, component 140 includes (but is not limited to) two such pads 160 which are in electrical contact with two traces 116. In this manner, component 140 may be in electrical signal communication with other electrical components in the package 100 and/or external to the package 100 through the RDL 102. For example, where component 140 is an emitter, the pads 160 may provide p-side and n-side connection to a light emitting diode.

Component 142 may include one or more electrical pads 162 which may form portions of the top surface 152. Pads 162 may be in electrical communication with the component 142 itself, for transmitting electrical signals to and from the component in a known manner. In embodiments, one or more of the pads 162 may be in electrical contact with one or more electrically conductive vias 164 to connect the component 142 to traces 122 of RDL 104. In this manner, component 142 may be in electrical signal communication with other electrical components in the package 100 and/or external to the package 100 through the RDL 104, RDL 102, conductive column 174, vertical interconnects 132, and/or conductive bumps 124. In embodiments, component 142 may be in electrical signal communication with one or both of components 140, 144 through RDL 102, RDL 104, and/or vertical interconnects 132.

Component 144 may include one or more electrical pads 166 or the like which may form portions of the top surface 154. Pads 166 may be in electrical communication with the component 144 itself, for transmitting electrical signals to and from the component in a known manner. In embodiments, one or more of the pads 166 may be in electrical contact with one or more of the traces 116 of RDL 102; in the example of FIG. 1, component 144 may include (but is not limited to) one such pad 166 which is in electrical contact with one trace 116. In this manner, component 144 may be in electrical signal communication with other electrical components in the package 100 and/or external to the package 100 through the RDL 102.

Component 144 may include an incoming back side metallization layer 170 formed on and/or attached to the bottom surface 156 of the component, which may allow electrical communication with the component 144 at the bottom surface 156 through the layer 170. Metallization layer 170 may include a bottom surface 172. Metallization layer may be formed from one or more conductive materials, including, but not limited to, Ti/NiV/Au. For example, where component 140 is a photodetector, the pads 166 and back side metallization layer 170 may provide p-side and n-side connection to a photodiode.

As can be seen from the arrangement of pads 166 and back side metallization layer 170, the thickness of component 144 cannot be adjusted. Nevertheless, the thickness may have a certain variation or tolerance, which may change if provided by different vendors. The thicknesses of the components 140, 142 however are adjustable since no contact pads are provided on their back sides. Thus, thickness of the components 140, 142 may be adjusted after manufacture, and prior to packaging. In this manner, total thickness of the package 100 can be reliably produced by controlling thickness of the back-to-back stacked components, 140, 142. Where thickness of the component 144 with both top and back side connections cannot be adjusted, this may be compensated for by the provision of an electrically conductive column 174 with one or more stacked stud bumps 176 where thickness can be easily adjusted in a reliable, cost efficient, additive process while also protecting the integrity of the package components, including potentially chemically sensitive metallization layers in the back side metallization layer 170.

The packaging sequences described herein accommodate components of various thicknesses. For example, components can be thinner or thicker than either of the components 140, 142. In an embodiment, component 144 is thicker than the component 140 and/or component 142, so that there may be a portion of molding compound layer 106 between the bottom surface 172 of metallization layer 170 and the top surface 118 of RDL 104 which may be bridged in order to establish electrical communication between the component 144 and RDL 104. The Z-direction height of component 144 may vary somewhat because of manufacturing tolerances and/or differences between different manufacturers of component 144, and therefore there may be variation in the Z-direction distance between the bottom surface 172 of metallization layer 170 and the top surface 118 of RDL 104. The thickness of component 144 may not be adjustable, e.g., by grinding, because it may include contacts on both its top and bottom surfaces. Components 140 and 142 can be stacked back-to-back, e.g., using adhesive tape, as neither includes back side pads, and thus these components may be thinned on their back sides to much tighter manufacturing processes. In one aspect, this helps facilitate the formation of thin packages.

The electrically conductive column 174 extends between the bottom surface 172 of metallization layer 170 and the top surface 118 of RDL 104, which forms an electrical communication path therebetween. In embodiments, electrically conductive column 174 may be formed by one or more stud bumps 176 stacked one on the other to bridge the gap between the bottom surface 172 of metallization layer 170 and the top surface 118 of RDL 104. The Z-direction height of each stud bump 176 may have very close manufacturing tolerances which permits a stud-bump-column to more exactly electrically connect the component 144 and the RDL 104. Stud bump(s) 176 may be formed of solder, Au, Cu, or other suitable, electrically conductive material, and the stud bumps may be formed of different materials in a single column. The material of all the stud bump(s) 176, or only the bottommost stud bump, may be selected to be easily milled to permit even more precise manufacturing of the Z-direction height of the conductive column 174.

The electrically conductive columns 174 can potentially be formed using alternative manufacturing techniques, such as growth of conductive columns (e.g. plating), or deposition of a conductive material within a patterned trench. Use of stacked stud bumps in accordance with embodiments may avoid process sequences associated with other techniques, such as etching through a patterning material to expose the back side metallization layer 170, which can potentially damage the metallization layer 170, or exposure of the package 100 components to chemicals that can by potentially harmful. In one aspect, the electrically conductive column(s) may control total thickness for package manufacturing, where the electrically conductive column, which may be formed in whole or in part of stud bumps, may be needed to account for component 144 thickness variation primarily.

Figure 2A:
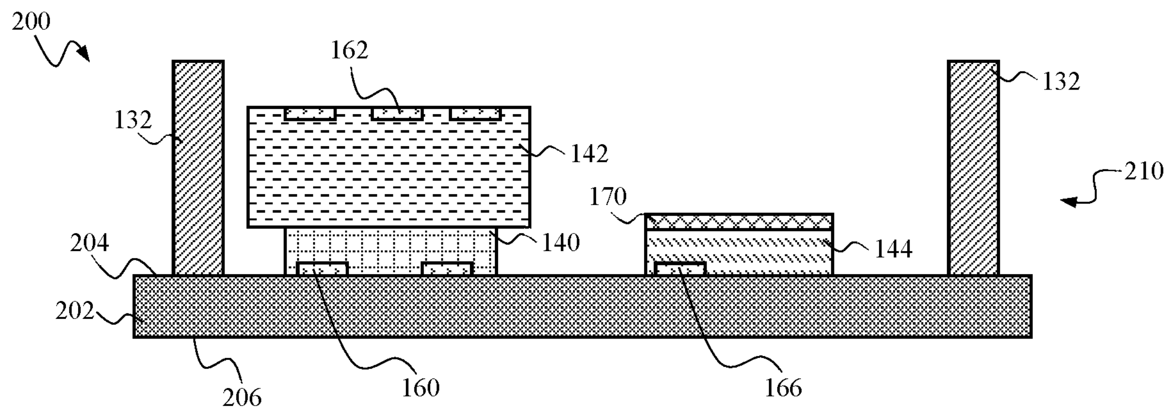
FIGS. 2A-2H illustrate schematic cross-sectional side view illustrations of a method of fabricating an optical package of FIG. 1 in accordance with an embodiment.
Figure 2B:
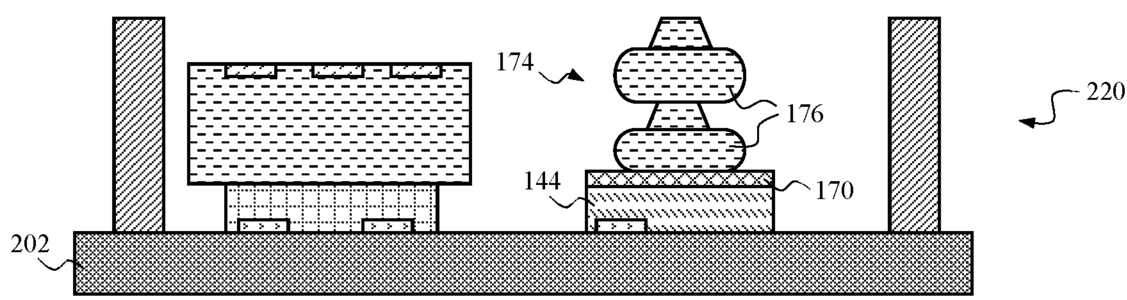
Figure 2C:
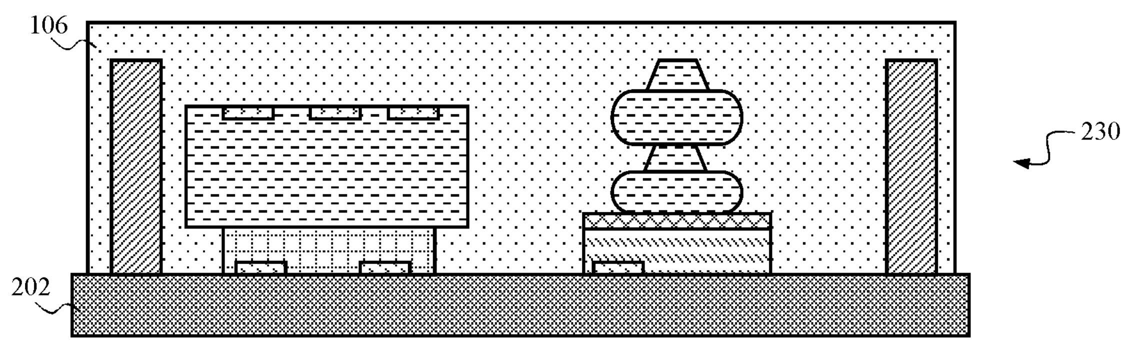
Figure 2D:
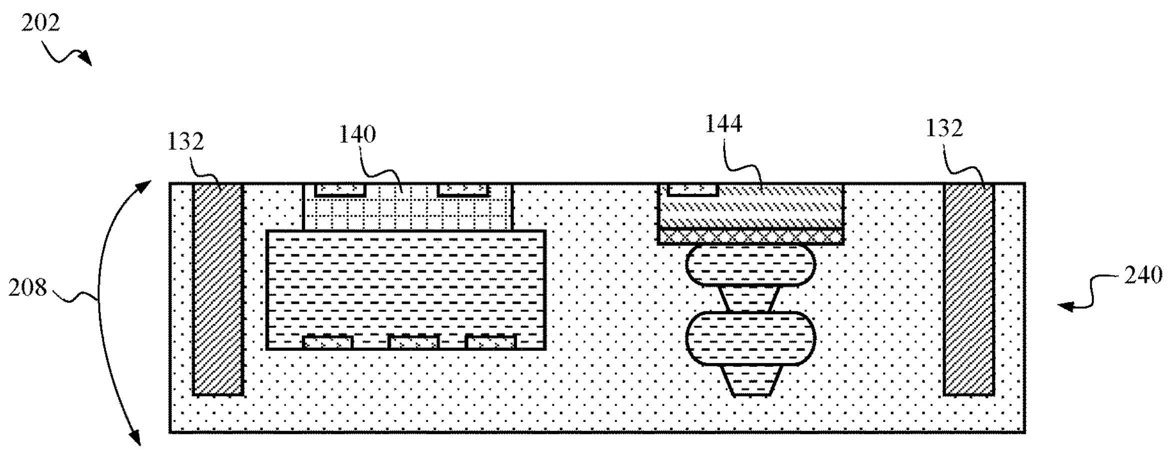
Figure 2E:
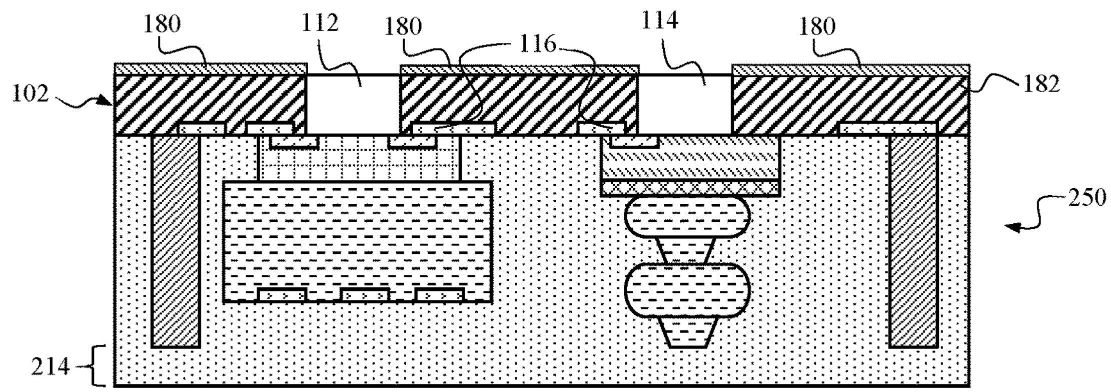
Figure 2F:
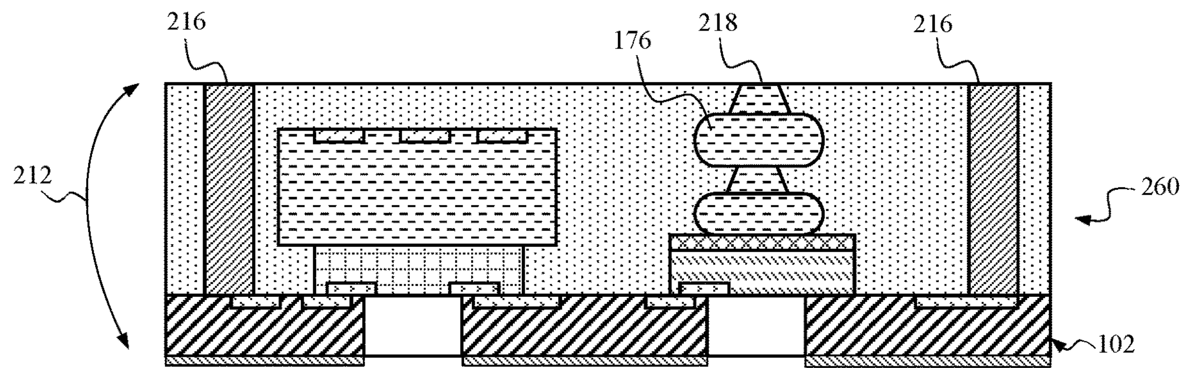
Figure 2G:
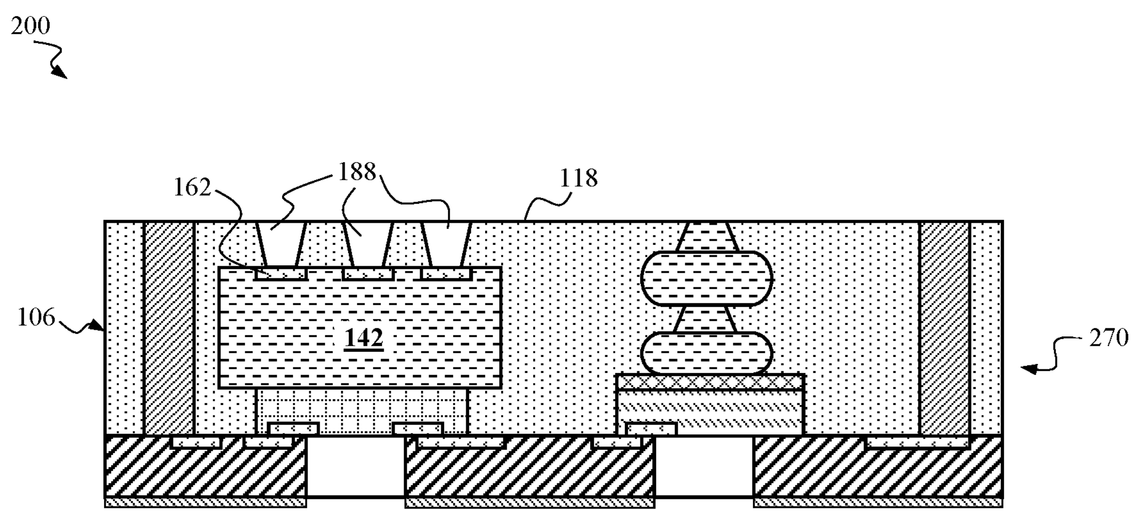
Figure 2H:
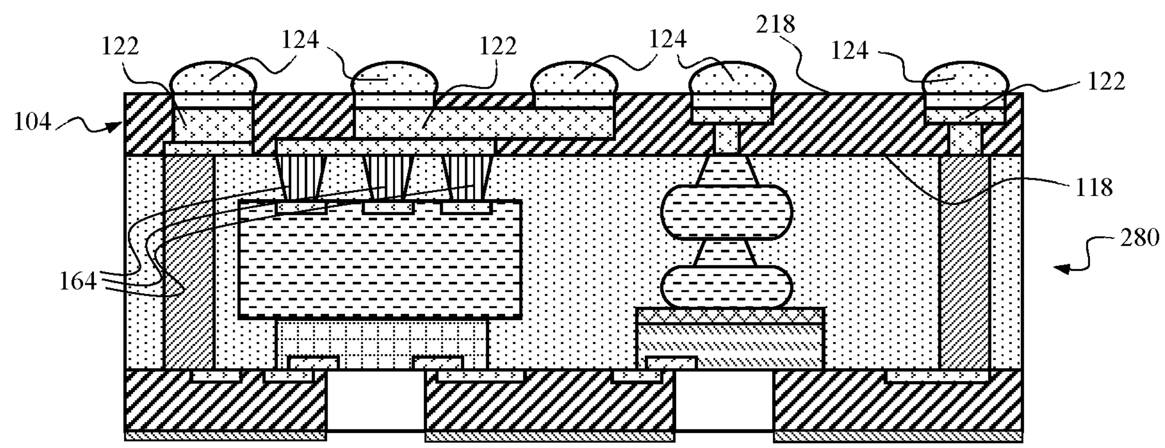
Figure 3:
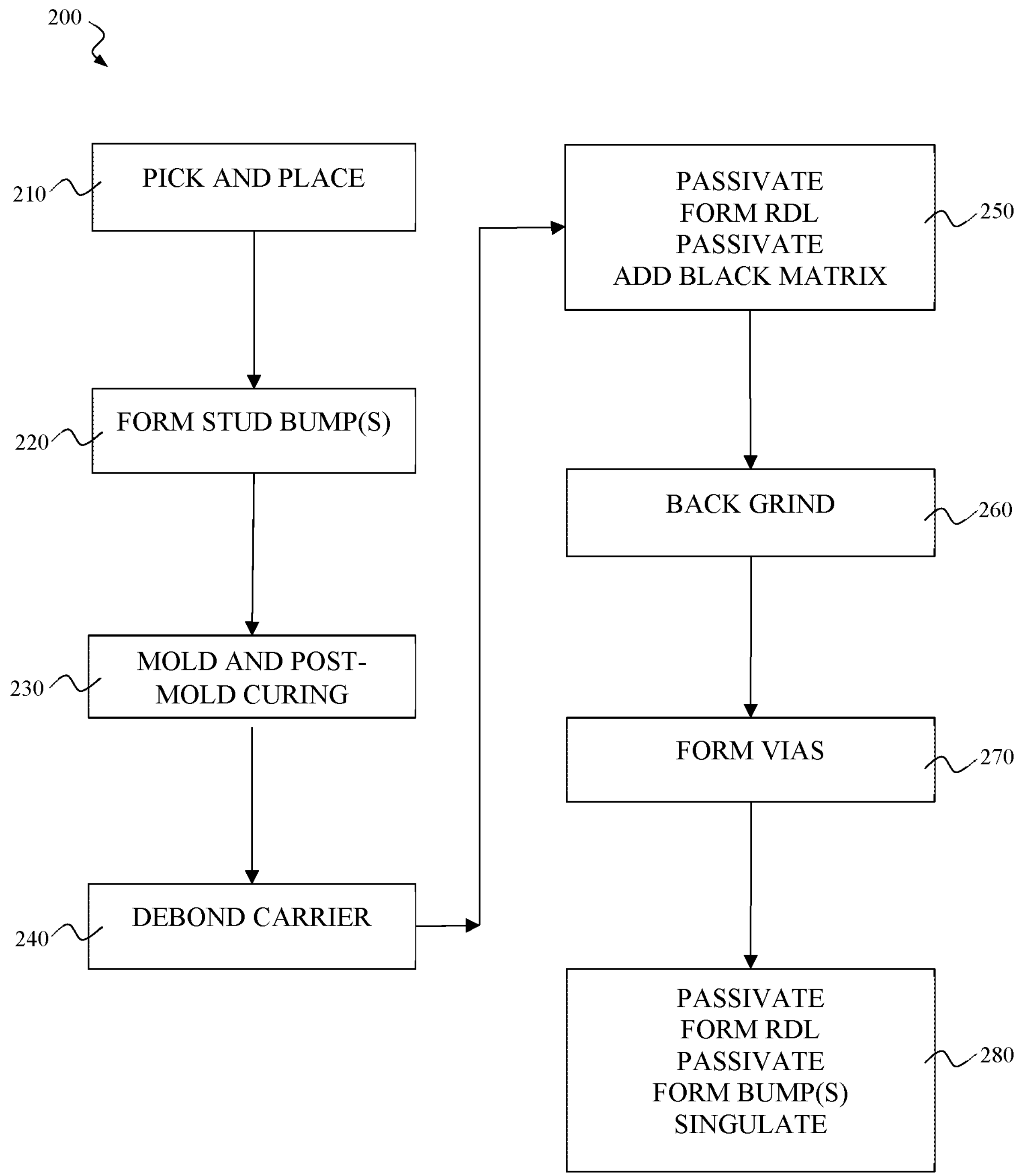
FIG. 3 illustrates a process flow of a method of fabricating the optical package of FIG. 1 in accordance with an embodiment.

Turning now to FIGS. 2A-3, an example method 200 of forming a microelectronic package, such as package 100, is illustrated and described. In a first operation 210, which may be a pick and place operation, a carrier 202 with a top surface 204 and a bottom surface 206 is provided. Carrier 202 can be formed of one or more of numerous materials, e.g., glass, and may include an adhesive layer (not illustrated) on top surface 204 to at least temporarily secure other subcomponents to the carrier. Vertical interconnect(s) 132 are formed (e.g., as plated copper posts) or placed (e.g., as PCB bars) on top surface 204; component 140 is placed on top surface 204 with pads 160 oriented towards the carrier 202; and component 144 is placed on top surface 204 with pad(s) 166 oriented towards the carrier 202. Component 142 is placed on component 140 in a back-to-back orientation, as described above with reference to FIG. 1, with pads 162 oriented away from carrier 202. An adhesive layer (not illustrated), which may be a die attach film (DAF), may be provided between components 140, 142 to at least temporarily hold the two components together. Components 140, 142 may be pre-assembled together and then picked and placed onto carrier 202, or may be serially picked and placed.

A second operation 220, which may follow operation 210 and be a stud bump formation operation, is illustrated in FIGS. 2B and 3; in FIG. 2B, reference numerals of some elements discussed with reference to FIG. 2A have been excluded to not obscure some features. A conductive column 174 is added on the metallization layer 170 of component 144 opposite carrier 202. In embodiments, and as discussed elsewhere herein, conductive column 174 may be formed in situ on the exposed surface of the metallization layer 170 by the formation of one or more stud bumps 176 stacked, one on another, in the Z-direction. The one or more stud bump (s)s 176 may be formed of solder, Cu, Au, or other suitable, electrically conductive material. The material of all the stud bump(s) 176, or only the uppermost (in the orientation of FIG. 2B) stud bump, may be selected to be easily milled to permit even more precise manufacturing of the Z-direction height of the conductive column 174.

A third operation 230, which may follow operation 220 and may be a molding and post-mold curing operation, is illustrated in FIGS. 2C and 3; in FIG. 2C, reference numerals of some elements discussed with reference to FIGS. 2A and 2B have been excluded to not obscure some features. A molding compound layer 106 of molding compound is formed on top of the carrier 202 and fully encapsulating the vertical interconnects 132, components 140, 142, 144, and column 174. The mold compound is cured in a known manner.

A fourth operation 240, which may follow operation 230 and may be a carrier debonding operation, is illustrated in FIGS. 2D and 3; in FIG. 2D, reference numerals of some elements discussed with reference to FIGS. 2A-2C have been excluded to not obscure some features. The entire assembly from the end of operation 230 may be flipped, as suggested by arrow 208. Carrier 202 may be de-bonded and removed from the vertical interconnects 132 and components 140, 144, exposing top surface 128, top surface 146, and top surface 154.

A fifth operation 250, which may follow operation 240 and may be a passivation and RDL formation operation, is illustrated in FIGS. 2E and 3; in FIG. 2E, reference numerals of some elements discussed with reference to FIGS. 2A-2D have been excluded to not obscure some features. An RDL 102 may be formed on top surface 128, top surface 146, and top surface 154, and may include traces 116 and optical windows 112, 114, such as those described elsewhere herein. Operation 250 may include passivation before and/or after formation of RDL 102. Optionally, an optically opaque layer, e.g., a black matrix layer 180, may be added over some or all of RDL 102. For example, the black matrix layer 180 may reduce cross-talk between components 140, 144 where they are optical components (e.g. emitter, photodetector).

A sixth operation 260, which may follow operation 250 and may be a back grind operation, is illustrated in FIGS. 2F and 3; in FIG. 2F, reference numerals of some elements discussed with reference to FIGS. 2A-2E have been excluded to not obscure some features. The entire assembly from the end of operation 250 may be flipped, as suggested by arrow 212. A portion 214 (see FIG. 2E) of the assembly from the end of operation 250 may be back ground from the assembly, which may include grinding down to the top (in the orientation of FIG. 2F) surfaces 216 of vertical interconnects 132, and/or the top surface 218 of uppermost stud bump 176. Operation 260 may include grinding down both vertical interconnects 132, and an upper (in the orientation of FIG. 2F) portion of uppermost (in the orientation of FIG. 2F) stud bump 176. In this way, a stud bump 176 may be at least partially sacrificial to better control the total Z-direction height between the bottom (in the orientation of FIG. 2F) surface of RDL 102 and surface 218.

A seventh operation 270, which may follow operation 260 and may be a via formation operation, is illustrated in FIGS. 2G and 3; in FIG. 2G, reference numerals of some elements discussed with reference to FIGS. 2A-2F have been excluded to not obscure some features. Via openings 186 are formed in the molding compound layer 106 from the surface 118 to the pad(s) 162 of component 142. As described elsewhere herein, one via 164 may be formed for each pad 162. Via openings 188 may be formed by laser etching away the material of molding compound layer 106 in the Z-direction from surface 118 down to the pad(s) 162 to form cavities in the molding compound layer 106. Via openings 188 may be frustoconical in shape.

As an alternative to some or all of the operation 270 of FIG. 2G, component 142 may include pre-formed vias 164 that protrude from the component 142 in the manner illustrated in, e.g., FIG. 1. Providing a component with pre-formed vias 164 permits the vias to be exposed during a back grinding step, e.g., in operation 260 of FIG. 2F. This would further facilitate not having to expose the package 100 to harmful process chemicals the use of which may be involved in the formation of openings 188.

An eighth operation 280, which may follow operation 270 and may be a combined passivation, RDL formation, and bump formation operation, is illustrated in FIGS. 2H and 3; in FIG. 2H, reference numerals of some elements discussed with reference to FIGS. 2A-2G have been excluded to not obscure some features. An RDL 104 may be formed on surface 118, including top surface 218 and the exposed top (in the orientation of FIG. 2H) surfaces of vias 164. RDL 104 may be formed to include traces 122, such as those described elsewhere herein, and may include filling each via opening 188 with an electrically conductive material, e.g., copper, if not already formed. Bumps 124 may be formed into and/or onto RDL 104 in a known manner, forming electrical connection with traces 122. Operation 280 may include passivation before and/or after formation of RDL 104. Packages 100 may thereafter be singulated, if necessary.

Figure 4A:
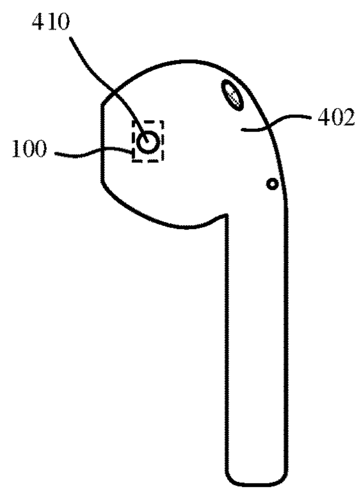
FIGS. 4A-4B illustrate schematic side views of an earbud in accordance with an embodiment.
Figure 4B:
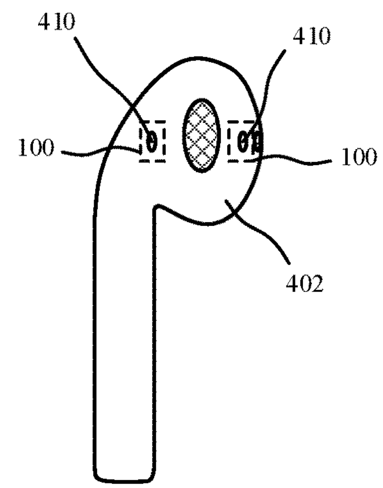
Figure 5:
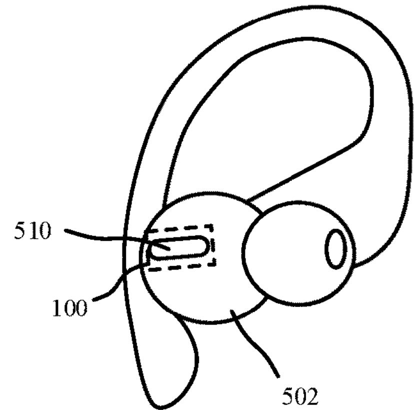
FIG. 5 illustrates a schematic side view of an earpiece in accordance with an embodiment.
Figure 6:
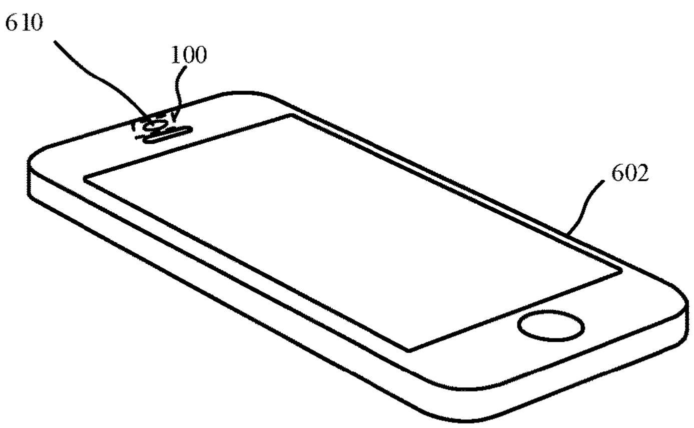
FIG. 6 illustrates a schematic side view of a mobile phone in accordance with an embodiment.

FIGS. 4A-6 illustrate various portable electronic devices in which the various embodiments can be implemented. FIGS. 4A-4B are schematic side view illustrations of an earbud in accordance with an embodiment that includes a housing 402 and one or more openings 410 to which the optical components (e.g. photodetector, emitter) of an optical sensor module, which may include a package 100 described herein, can be aligned adjacently. FIG. 5 is a schematic side view illustration of an earpiece in accordance with an embodiment that includes a housing 502 including an opening 510 to which the optical components (e.g. photodetector, emitter) of an optical sensor module, which may include a package 100 described herein, can be aligned adjacently. FIG. 6 is a schematic side view illustration of a mobile phone in accordance with an embodiment including a housing 602 including an opening 610 to which the optical components (e.g. photodetector, emitter) of optical an sensor module, which may include package 100 described herein, can be aligned adjacently. These illustrations are intended to be exemplary and non-exhaustive implementations.

In utilizing the various aspects of the embodiments, it would become apparent to one skilled in the art that combinations or variations of the above embodiments are possible for forming a package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration

What is claimed is:

1. A package comprising:

a first component including an electrically conductive pad on a top side of the first component, a second component, and a molding compound layer, the first component and the second component stacked back-to-back and encapsulated in the molding compound layer;

a third component encapsulated in the molding compound layer, the third component including a back side metallization layer and an electrically conductive pad on a top side of the third component;

a front side wiring layer on and in electrical connection with the electrically conductive pad on the top side of the first component and the electrically conductive pad on the top side of the third component;

an electrically conductive column including a plurality of stacked stud bumps extending from the back side metallization layer on the back side of the third component and encapsulated in the molding compound layer, wherein the stud bumps of the plurality of stacked stud bumps are stacked directly on top of one another and the molding compound layer is in direct contact with the plurality of stacked stud bumps; and a back side wiring layer on and in electrical communication with the second component and the electrically conductive column.

2. The package of claim 1, further comprising a back ground surface spanning the molding compound layer and a stud bump of the electrically conductive column, wherein the back side wiring layer is formed on the back ground surface.

3. The package of claim 1, wherein the second component includes at least one electrically conductive pad on a side opposite said first component, and said back side wiring layer comprises at least one conductive trace, and further comprising:

at least one via extending between and electrically connecting said at least one electrically conductive pad of said second component and said at least one conductive trace of said back side wiring layer.

4. The package of claim 1, further comprising:

at least one electrically conductive bump in electrical communication with and on said back side wiring layer, said at least one bump being positioned on a side of said back side wiring layer opposite said front side wiring layer.

5. The package of claim 1, wherein:

said first component comprises a back side;

said second component comprises a top side and a back side;

said first component back side and said second component back side are mounted together to form a back-to-back stack; and said first component back side and said second component back side are not in electrical communication.

6. The package of claim 1, wherein:

the second component includes at least one electrically conductive pad on a side opposite said first component;

said back side wiring layer comprises at least one conductive trace; and said second component is in electrical communication with said third component through said electrically conductive column and said back side wiring layer.

7. The package of claim 1, wherein said third component comprises at least one electrically conductive pad on a top side and in electrical communication with said front side wiring layer.

8. The package of claim 1, further comprising:

at least one vertical interconnect extending completely between said front side wiring layer and said back side wiring layer.

9. The package of claim 8, wherein said at least one vertical interconnect comprises a printed circuit board (PCB) bar.

10. The package of claim 9, further comprising:

at least one electrically conductive bump in electrical communication with and on said back side wiring layer, said at least one bump being positioned on a side of said back side wiring layer opposite said front side wiring layer; and wherein said at least one electrically conductive bump is in electrical communication with said front side wiring layer through said at least one electrically conductive vertical interconnect.

11. The package of claim 8, wherein said at least one vertical interconnect comprises a plurality of vertical interconnects.

12. The package of claim 1, further comprising:

a first optical window in the front side wiring layer over the first component, and a second optical window in the front side wiring layer over the third component.

13. The package of claim 12, wherein:

the first component is a light emitter; and the third component is a photodetector (PD).

14. The package of claim 13, wherein the PD comprises a back side metallization layer, and said electrically conductive column is on said back side metallization layer and electrically connects said back side metallization layer to said back side wiring layer.

15. A portable electronic device comprising:

a housing having an opening; and the package of claim 1, wherein at least one of the first and third components is mounted adjacent to said opening.

16. A process of forming a package, the process comprising:

placing first, second, and third components on a carrier, with the first and second components arranged back-to-back, and the third component including a back side metallization layer;

forming a column of electrically conducting stud bumps on said third component back side metallization layer, wherein the electrically conducting stud bumps are stacked directly on top of one another;

encapsulating said first, second, and third components, and said column of electrically conducting stud bumps, in a molding compound to form a molding compound layer, wherein the molding compound layer is in direct contact with the electrically conducting stud bumps;

removing the carrier;

forming a front side wiring layer on and in electrical connection with an electrically conductive pad on a top side of the first component and an electrically conductive pad on a top side of the third component;

back grinding said molding compound layer to expose a portion of said column of electrically conducting stud bumps; and forming a back side wiring layer in direct electrical contact with said column of electrically conducting stud bumps and said second component.

* * * * *